United States Patent
Gardner et al.

[11] Patent Number: 6,030,860
[45] Date of Patent: Feb. 29, 2000

[54] ELEVATED SUBSTRATE FORMATION AND LOCAL INTERCONNECT INTEGRATED FABRICATION

[75] Inventors: Mark I. Gardner; Daniel Kadosh; Michael P. Duane, all of Austin, Tex.

[73] Assignee: Advanced Micro Devices, Inc., Sunnyvale, Calif.

[21] Appl. No.: 08/993,332

[22] Filed: Dec. 19, 1997

[51] Int. Cl.[7] .................. H01L 21/00; H01L 21/8236
[52] U.S. Cl. ................ 438/151; 438/152; 438/268
[58] Field of Search ........................... 438/152, 151, 438/231, 268, 305, 303, 622, 299

[56] References Cited

U.S. PATENT DOCUMENTS

| | | | |
|---|---|---|---|
| 4,902,637 | 2/1990 | Kondou et al. | 437/51 |
| 5,155,058 | 10/1992 | Fujiwara et al. | 437/52 |
| 5,484,738 | 1/1996 | Chu et al. | 437/33 |
| 5,683,918 | 11/1997 | Smith et al. | 437/21 |
| 5,741,733 | 4/1998 | Bertagnolli et al. | 438/152 |
| 5,744,384 | 4/1998 | Adler et al. | 438/152 |
| 5,770,483 | 6/1998 | Kadosh et al. | 438/152 |
| 5,863,818 | 1/1999 | Kadosh et al. | 438/152 |
| 5,874,343 | 2/1999 | Fulford, Jr. et al. | 438/305 |
| 5,885,879 | 3/1999 | Gardner et al. | 438/305 |
| 5,898,189 | 4/1999 | Gardner et al. | 438/152 |
| 5,937,321 | 8/1999 | Beck et al. | 438/622 |
| 5,950,082 | 9/1999 | Gardner | 438/231 |
| 5,953,612 | 9/1999 | Lin et al. | 438/299 |

*Primary Examiner*—John F. Niebling
*Assistant Examiner*—Michael S. Lebentritt
*Attorney, Agent, or Firm*—Skjerven, Morrill, MacPherson, Franklin & Friel, LLP; Kent B. Chambers

[57] ABSTRACT

A wafer includes levels elevated above the wafer substrate or base substrate which includes separated substrates suitable for circuit device element formation. In one embodiment, a first level dielectric is formed over circuit devices having elements formed in the wafer substrate. Contacts from the circuit elements may extend to the surface of the first level dielectric. A second dielectric is formed on the first level dielectric and etched to create separated openings with some openings exposing contacts. The openings are filled with substrate material, thus forming elevated substrates and local interconnects where exposed contact top surfaces are present. The substrate material is suitable for circuit device fabrication. Additional levels of elevated substrates and concurrently formed local interconnects may be subsequently fabricated.

37 Claims, 2 Drawing Sheets

ELEVATED SUBSTRATE FORMATION AND LOCAL INTERCONNECT INTEGRATED FABRICATION

BACKGROUND OF THE INVENTION

1. Field of the Invention

This invention relates to integrated circuits and more particularly relates to an apparatus and method of using shared process steps to fabricate one or more separated, elevated substrates suitable for circuit element fabrication and one or more local interconnects to connect conductive circuit device elements.

2. Description of the Related Art

Integrated circuits and the systems which utilize them have become ubiquitous throughout the world. A typical wafer includes integrated circuits having a large number of circuit devices such as insulated gate field effect transistors (IGFETs) and other circuit devices which are fabricated on a single substrate, normally silicon. Referring to FIG. 1, fabrication of the multilevel interconnect structure of integrated circuit 100 is preceded by the fabrication of an exemplary N-channel IGFET 101. IGFET 101 includes field oxide isolation regions 120 and 122 which are formed in substrate 110 to isolate the IGFET 101 from adjacent devices (not shown). The IGFET 101 of conventional integrated circuit 100 uses a polysilicon gate 102, separated from the substrate 110 by a thin insulating layer 112, to control an underlying channel 104 which joins doped source/drain 106 and source/drain 108. The source/drain 106 and source/drain 108 are doped oppositely to the channel 104 and the substrate 110. The operation of the IGFET 101 involves application of an input voltage to the gate 102, which sets up a transverse electric field in the channel 104 to modulate the conductance of the channel 104 between source/drain 106 and source/drain 108.

Following fabrication of the IGFET 101, an insulation layer 114 made of chemical vapor deposition (CVD) silicon dioxide, for example, is conformally formed over the IGFET 101 and substrate 110. Contact holes (also referred to as 'windows') are then typically opened through the insulation layer prior to formation of the overlying thin film interconnects 116 and 118 and filled with a conductive film to form contacts 103a and 103b. IGFET 101 is interconnected with other circuit devices (not shown), generally using high conductivity, thin film structures, such as metal interconnects 116 and 118, which are patterned above insulation layer 114. Contacts 103a and 103b electrically connect interconnects 116 and 118 with source/drain 106 and source/drain 108, respectively.

The fabrication of other IGFETs (not shown) in substrate 110 may be similarly carried out while utilizing appropriate isolation techniques. Additionally, higher order multilevel interconnect structures may be fabricated to facilitate desired connectivity.

Although there is much variation in particular device structures and process techniques, conventional integrated circuit fabrication techniques generally focus upon single device layers with multilevel interconnect structures limits, for example, design flexibility and density.

SUMMARY OF THE INVENTION

The present invention addresses, for example, the density and flexibility limitations of conventional integrated circuit fabrication and resulting structures. In one embodiment, circuit device density is improved by selectively fabricating separated elevated substrates suitable for circuit device fabrication. Separated elevated substrates may also function as local interconnects to interconnect circuit elements. Furthermore, separated substrates and local interconnects may be fabricated using shared or identical process steps and concurrently planarized, thus, efficiently using process steps.

In one embodiment of the present invention, a method of fabricating integrated circuits includes the steps of forming circuit device elements in a base substrate of a wafer, forming a first dielectric layer over the base substrate, forming contacts in the first dielectric layer to at least a portion of the circuit device elements, forming an elevated substrate in a selected area over the base substrate, wherein the elevated substrate is suitable for forming circuit device elements therein, and forming a local interconnect during the formation of the elevated substrate and separated from the elevated substrate to interconnect at least two of the contacts formed in the first dielectric layer.

In another embodiment of the present invention, an integrated circuit includes a first substrate, a plurality of circuit device elements disposed in the first substrate, a dielectric layer disposed over the first substrate, and a second substrate disposed in the dielectric layer.

BRIEF DESCRIPTION OF THE DRAWINGS

Features appearing in multiple figures with the same reference numeral are the same unless otherwise indicated.

DETAILED DESCRIPTION OF THE PREFERRED EMBODIMENTS

The following description of the invention is intended to be illustrative only and not limiting.

There is a relentless trend in the semiconductor manufacturing business to develop fabrication processes which allow increased circuit device density and layout flexibility. Embodiments described herein may be utilized to increase device density, i.e., increase a number of circuit devices per integrated circuit chip area, by selectively forming one or more separated substrates elevated over a base substrate of a wafer. Furthermore, during the elevated substrate formation, local interconnects may be formed to interconnect circuit device elements. The elevated substrates and local interconnects may be formed concurrently in the sense that process steps are common to the fabrication of both the elevated substrates and local interconnects. By selectively removing portions of the second level dielectric layer and forming substrate material therein, elevated substrates suitable for circuit device fabrication are formed. Concurrently, selected portions of the second dielectric layer may be removed to expose interlevel interconnects, such as contacts or vias, and the substrate material may also be formed therein to form local interconnects. Substrate material may be any well-known suitable material such as deposited polysilicon or sputtered silicon. Resistance of the local interconnect may be lowered by, for example, forming a self-aligned, silicide of the local interconnect. In some embodiments, additional process steps are used to, for example, lower the resistivity of the local interconnects. In one embodiment, elevated substrates and local interconnects are formed in a second level dielectric which is deposited on a first level dielectric. It will be recognized by persons of ordinary skill in the art that formation of same-level, separated elevated substrates with or without concurrent fabrication of local interconnects may be accomplished in a variety of manners and only exemplary techniques are described herein.

Figure 1:
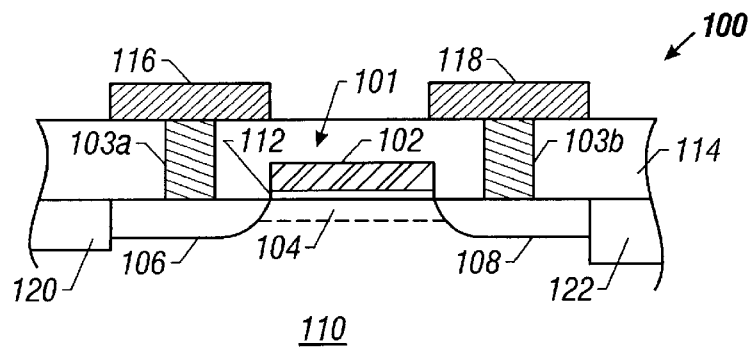
FIG. 1 (labeled prior art) is a cross-sectional side view of an IGFET and multilevel interconnect structure.
Figure 2:
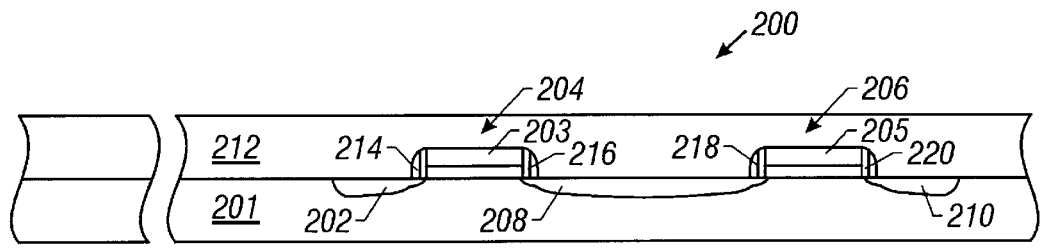
FIGS. 2–6 illustrate cross-sectional elevation views of progressive processing steps utilized in accordance with an embodiment of this invention to concurrently fabricate same level separated elevated substrates and local interconnects of an integrated circuit.

Referring to FIGS. 2–6, cross-sectional elevation views illustrate an embodiment of progressive processing steps utilized to concurrently fabricate separated elevated substrates and local interconnects of an integrated circuit 200. In FIG. 2, IGFETs 204 and 206 are formed in a well-known manner with source/drain circuit elements 202, 208, and 210 formed in the wafer substrate or base substrate 201. The gates 203 and 205 of IGFETs 204 and 206, respectively, are formed of heavily doped polysilicon to match the melting point of base substrate 201. Since the polysilicon has the same melting point as a silicon substrate, it can be deposited prior to source/drain formation and serve as a mask during introduction of the source/drains 202, 208, and 210 by ion implantation. The resistance of polysilicon can be further reduced by forming a silicide on its top surface. Silicon spacers 214, 216, 218, and 220 are formed to protect the lightly doped positions of the source/drain regions from subsequent doping of the source/drains 202, 208, and 210. A dielectric 212 is formed on the surface of base substrate 201, and dielectric 212 may be fabricated as an inner layer dielectric (ILD) with three stacked layers. When fabricating dielectric 212 as an ILD, a 500–1,000 Å (angstroms) thick silicon oxide layer is formed on the surface of base substrate 201 to getter impurities and prevent further doping of base substrate 201. The ILD is further formed by depositing a low temperature 3–5% phosphorus doped silicon dioxide layer (phosphosilicate glass or "PSG") followed by deposition of a 500–1,000 Å silicon dioxide layer. The total depth of dielectric 212 is approximately 12 k–20 k Å. The exposed surface of dielectric 212 is flattened using well-known chemical mechanical polishing (CMP) techniques.

Figure 3:
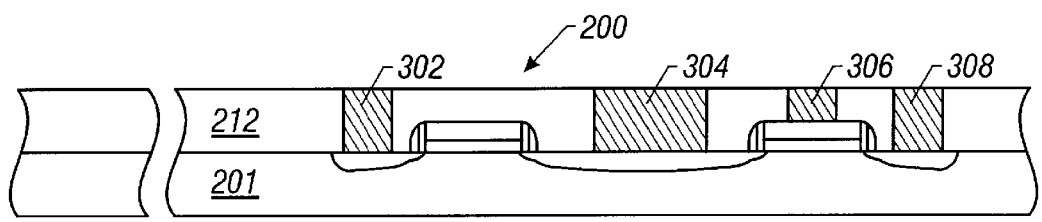

Referring to FIG. 3, a contact mask (not shown) of photoresist is formed and patterned to expose a surface of dielectric 212 corresponding to regions in which contacts 302, 304, 306, and 308 will be formed. The exposed dielectric is etched using a timed plasma etch to open contact holes which are generally greater than or equal to 0.2 µm (microns). It will be recognized that other well-known removal techniques may be used such as etch chemistry which discriminates against the source/drains 202, 208, and 210. The contacts are formed by depositing any well-known contact material and liners to a depth of about twice the depth of contacts 302, 304, 306, and 308. For example, contacts 302, 304, 306, and 308 may be formed of tungsten, aluminum, copper, titanium (Ti), polysilicon, and alloys thereof. When using tungsten as a contact, a Ti nitride liner is preferably deposited, and when using polysilicon, a 250–500 Å Ti liner is deposited to lower contact resistance. Contact fill material is removed from outside the contact holes and the surface of dielectric 212 is flattened with a CMP process. If polysilicon is used for the contact material, a metal cap such as a 250–500 Å Ti cap may be deposited on the exposed top surface of the contacts to form a silicide.

Figure 4:
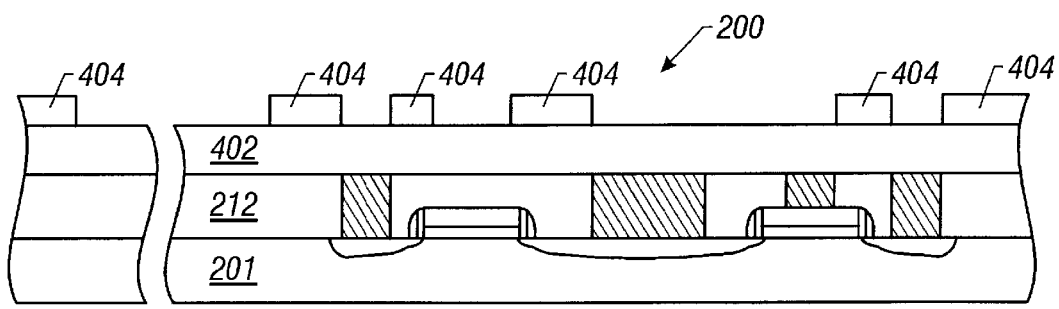

Referring to FIG. 4, a 1–4 µm silicon oxide dielectric layer 402 is formed at 300–400° C. from a silane plasma in a nitrogen environment. The dielectric layer 402 provides electrical isolation between subsequently formed elevated substrates and local interconnects. Photoresist 404 is deposited and patterned in a well-known manner to expose the top surface of dielectric layer 402 corresponding to areas of elevated substrate and local interconnect formation. The exposed portions of dielectric layer 402 are subsequently removed by etching to the top surface of second level dielectric layer 402. Following formation of the openings in dielectric layer 402, the photoresist 404 is removed in a well-known manner.

Figure 5:
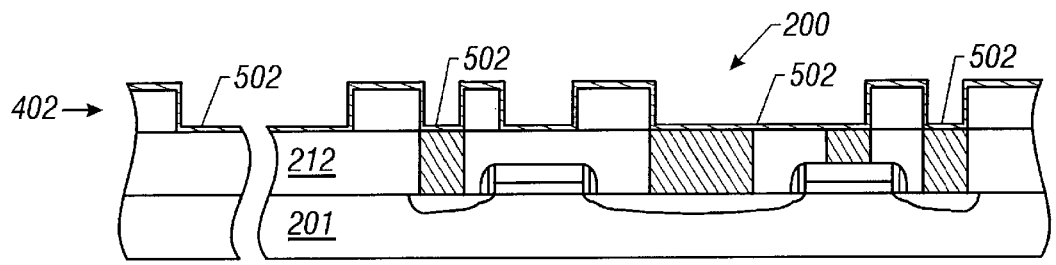

Referring to FIG. 5, the separated openings in the second level dielectric 402 provide independent locations for formations of elevated substrates and/or local interconnects. The elevated substrates are suitable for circuit element fabrication sites and, thus, may increase device density by increasing the number of circuit devices per chip. Separated elevated substrates also enhance layout flexibility to some degree by selectively locating separated elevated substrates anywhere over the wafer surface and allowing isolation or subsequent interconnection between same level circuit elements. In one embodiment, the resistivity of local interconnects 607, 608, and 610 (FIG. 6) is lowered by conformally depositing a low resistance film on the top surface of dielectric layer 402. When polysilicon is used to fill the separated openings in dielectric layer 402, a thin Ti liner 502 is deposited.

Figure 6:
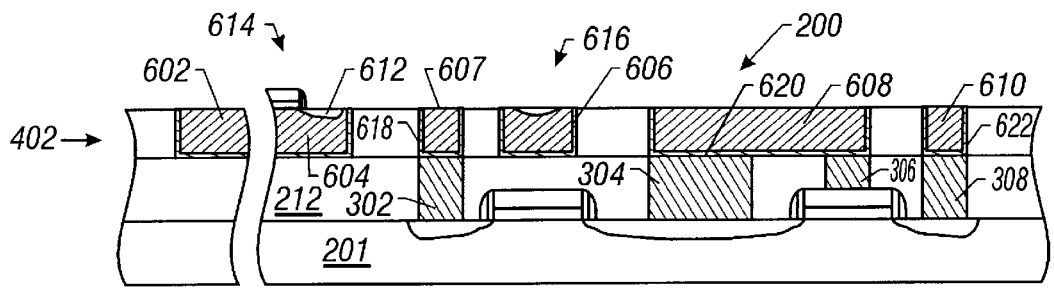

Referring to FIG. 6, polysilicon is blanket deposited at a rate of 50–100 Å/min at about 620° C. using low pressure chemical vapor deposition to a depth of about two times the depth of dielectric layer 402 to fill the openings in dielectric layer 402. Polysilicon and Ti liner 502 deposited outside of the openings are removed with a CMP process to form elevated substrates 602, 604, and 606 and local interconnects 607, 608, and 610. When the contacts 302, 304, 306, and 308 are formed of polysilicon with the Ti cap and local interconnects 607, 608, and 610 are lined with thin Ti layers 618, 620, and 622, respectively, a relatively low resistance interface is formed between the contacts 302 and 308 and local interconnects 607 and 610, respectively, and between contacts 304 and 306 and local interconnect 608. The Ti liner in elevated substrates 602, 604, and 606 is thin enough and the depth of dielectric layer 402 sufficient, that circuit device formation and operation in the elevated substrates 602, 604, and 606 is preferably not affected. Additionally, in another embodiment, the Ti liners used as part of local interconnects 607, 608, and 610 is masked, and the exposed portions of Ti liner 502 are removed by etching.

Other substrate materials besides polysilicon, such as sputtered silicon, may be used to form elevated substrates 602, 604, and 606 and local interconnects 607, 608, and 610. Deposition of the silicon would be followed by a removal process such as CMP to remove the sputtered silicon from the surface of dielectric layer 402.

In the event that the thin layer 502 deposited is not formed in the local interconnects 607, 608, and 610 openings prior to filling with polysilicon, a mask may be formed to expose only the surface polysilicon of local interconnects 607, 608, and 610. The conductivity of the local interconnects 607, 608, and 610 may then be increased by doping the exposed polysilicon using a well-known high energy dopant implant process. In another embodiment, Ti may deposited on the exposed polysilicon of local interconnects 607, 608, and 610 and a silicide may be formed by heating integrated circuit 200 to about 700–900° C. In a further embodiment, the local interconnects 607, 608, and 610 consist only of the deposited polysilicon.

Circuit elements, such as the source/drain 612 of IGFET 614 and source/drain of IGFET 616, may be formed in the elevated substrates 602, 604, and 606. Other circuit elements, such as capacitors and resistors and transistor circuit elements, may be formed in elevated substrates. Local interconnects 607 and 608 may interconnect with other local interconnects (not shown), disposed in dielectric layer 402, which are formed concurrently with local interconnects 607, 608, and 610. Although respective elevated substrates and local interconnects are initially isolated, they may be interconnected in a well-known manner or by repeating the process steps used to fabricate the elevated substrates and local interconnects and utilizing the local interconnects for interconnection. Additionally, only a representative sample of elevated substrates and local interconnects in dielectric layer 402 is shown. Such elevated substrates and local interconnects, both of any desired geometries, may be formed throughout dielectric layer 402.

Figure 7:
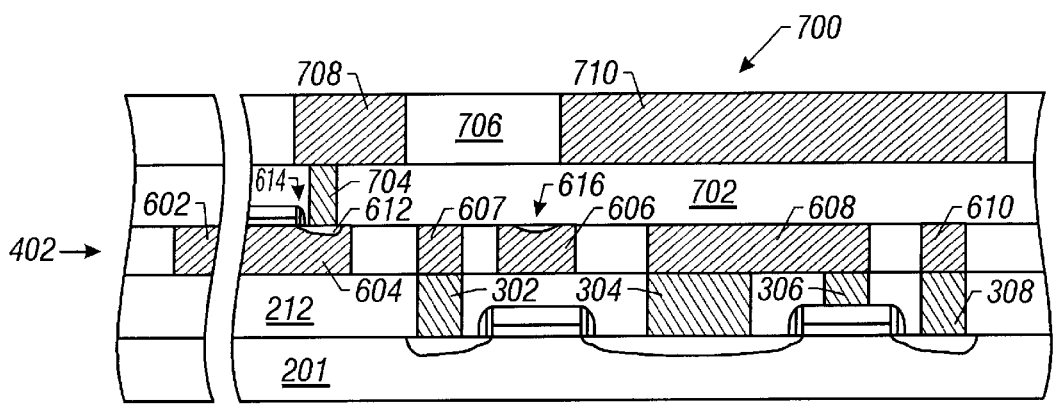
FIG. 7 illustrates, in a cross-sectional elevation view, further elevated substrate formation in a subsequently formed level of the integrated circuit of FIG. 6.

Referring to FIG. 7, additional chip levels with separated elevated substrates may be formed to farther enhance circuit device density and flexibility. Integrated circuit 700 includes a third level ILD 702 which is formed on the top surface of dielectric layer 402 and on circuit elements disposed therein. A contact hole is formed, filled, and external contact material removed to form via 704 in dielectric layer 702 in the same manner as forming contacts 302, 304, 306, and 308. A fourth level silicon oxide dielectric layer 706 is formed on the top surface of dielectric layer 702 in the same manner as dielectric layer 402 to support separation of fourth level elevated substrates. The fourth level separated elevated substrates and local interconnects are formed therein in predetermined, separated (independent) locations and in any of the same manners as elevated substrates 602, 604, and 606 and local interconnects 607, 608, and 610. Local interconnect 708 forms an exemplary interconnection between via 704 and another circuit element (not shown). Exemplary elevated substrate 710 is suitable for formation of additional circuit elements (not shown) such as source/drain regions. Additionally, low resistivity thin films, such as Ti liner 502, may be deposited so as to line all or selected elevated substrates and local interconnects as described above to lower resistivity of the local interconnects, or other processes, such as doping the exposed polysilicon using a well-known high energy dopant implant process. The process of building additional dielectric layers and elevated substrates and local interconnects may be continued so that as many levels are fabricated as desired. Furthermore, conventional layers may be interspersed between or fabricated on top of the elevated substrates and local interconnects.

Figure 8:
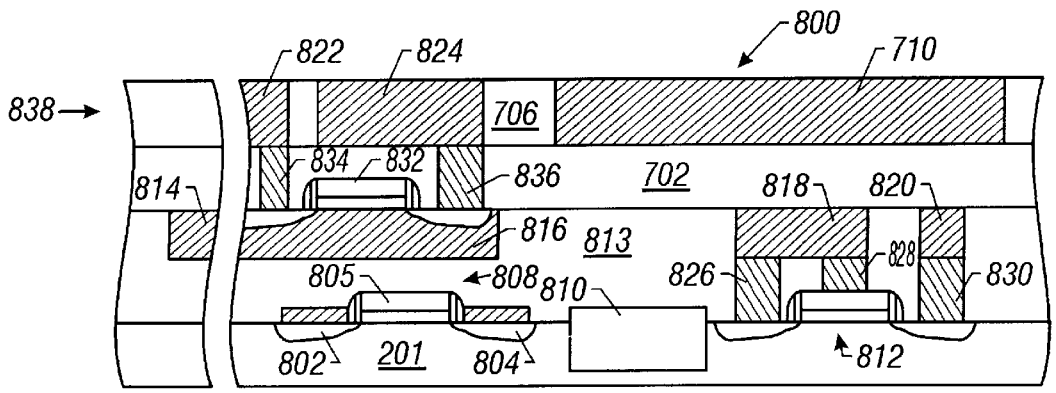
FIG. 8 illustrates, in a cross-sectional elevation view, another embodiment of concurrently formed multi-level, separated elevated substrates and local interconnects.

Referring to FIG. 8, the integrated circuit 800 illustrates another embodiment of elevated substrates and local interconnects which may further increase layout flexibility. The source/drain 802 and 804 interconnections to IGFET 808 are formed using, for example, a well-known self-aligned silicide (salicidation) formation process at about 700–900° C. so that interdevice interconnections are formed in the third dimension, i.e. into and/or out of the page. The polysilicon gate 805 may interconnect to other circuit devices (not shown). Resistance of the polysilicon gate may be decreased, for example, by forming, for example, a salicide with the polysilicon gate 805 and Ti. An oxide isolation region 810 is formed in base substrate 201 to isolate IGFET 808 from IGFET 812. ILD 813 is formed in the same manner as dielectric layer 402 except that the depth of ILD 813 is increased over the depth of dielectric layer 402 by the depth of elevated substrate 814 and local interconnects 818 and 820. After forming the openings for elevated substrate 814 and local interconnects 818 and 820, contact holes may be formed and filled to form contacts 826, 828, and 830. Elevated substrates 814 and 816 are formed in any of the same manners as elevated substrates 602 and 710 (FIGS. 6 and 7), and local interconnects 818 and 820 are formed using any of the processes as described in conjunction with local interconnects 607, 608, and 610 (FIG. 6). Circuit device elements such as the source/drains of IGFET 832 may be formed in elevated substrate 816 using conventional techniques. The fabrication of integrated circuit 800 continues by fabricating vias 834 and 836 through dielectric layer 702 in the same manner as via 704 formation, and additional levels of conventional multi-level interconnects or additional elevated substrate and local interconnect levels, such as level 838 may be fabricated. Local interconnects 822 and 824 are formed in the same manner as local interconnect 708.

Referring to FIG. 3, in another embodiment, substrate material, such as polysilicon, may be deposited on dielectric 212 and portions of the substrate material removed to define elevated substrates and local interconnects in locations such as those shown in FIG. 6. The substrate material may also include a low resistance liner, such as a Ti liner, formed prior to the remainder of the substrate material. Subsequently, a dielectric, such as silicon oxide, may be formed in the gaps between elevated substrates and local interconnects. The elevated substrate/local interconnect/dielectric layer may then be flattened and circuit device elements fabricated in the elevated substrate to form the structure shown in FIG. 6. Subsequent levels of elevated substrate(s), local interconnect(s), and dielectric may also be formed as described above.

It will be understood that the embodiments and variations of the embodiments described herein are well-suited for use in any integrated circuit chip, as well as an electronic system having a microprocessor, a memory, and a system bus.

While the invention has been described with respect to the embodiments and variations set forth above, these embodiments and variations are illustrative and the invention is not to be considered limited in scope to these embodiments and variations. For example, it will be known to persons of ordinary skill in the art that the uses of elevated substrates or of the structures that may be formed therein are not exhaustive. Furthermore, the specific process parameters and materials are exemplary. Accordingly, various other embodiments and modifications and improvements not described herein may be within the spirit and scope of the present invention, as defined by the following claims.

What is claimed is:

1. A method of fabricating integrated circuits comprising the steps of:

forming circuit device elements in a base substrate of a wafer;

forming a first dielectric layer over the base substrate;

forming contacts in the first dielectric layer to at least a portion of the circuit device elements;

forming an elevated substrate in a selected area over the base substrate, wherein the elevated substrate is suitable for forming circuit device elements therein; and forming a local interconnect during the formation of the elevated substrate and separated from the elevated substrate to interconnect at least two of the contacts formed in the first dielectric layer.

2. The method as in claim 1 wherein the step of forming an elevated substrate comprises the steps of:

depositing a second dielectric layer on the first dielectric layer;

removing a portion of the second dielectric layer, wherein the portion corresponds to the selected area over the wafer service; and depositing substrate material in the removed selected portion of the second dielectric.

3. The method as in claim 1 wherein the steps of forming an elevated substrate and forming a local interconnect comprises the steps of:

depositing substrate material over the first dielectric layer;

removing portions of the substrate material to define the elevated substrate and local interconnect; and forming a dielectric to separate the elevated substrate from the local interconnect.

4. The method as in claim 2 wherein the step of removing a portion of the second dielectric comprises the step of:

etching the selected portion of the second dielectric layer; and wherein the step of depositing the substrate material comprises the step of:
depositing a blanket layer of substrate material; and the method further comprises the step of:
removing the substrate material except for the substrate material in the selected area.

5. The method as in claim 2 wherein the second dielectric layer comprises silicon dioxide, and the substrate material comprises polysilicon.

6. The method as in claim 1 wherein the elevated substrate and local interconnects are comprised of polysilicon and a titanium liner underlying the polysilicon.

7. The method as in claim 1 further comprising the step of:

concurrently flattening the elevated substrate and local interconnect.

8. The method as in claim 1 further comprising the step of:

saliciding the local interconnect.

9. The method as in claim 1 further comprising the steps of:

forming a plurality of elevated substrates in respective separate areas over the wafer surface, wherein the elevated substrates are suitable for forming circuit device elements therein.

10. The method as in claim 9 wherein the step of forming a plurality of elevated substrates comprises the step of:

forming the plurality of elevated substrates in respective areas of a common layer disposed over the base substrate.

11. The method as in claim 1 further comprising the step of:

forming a plurality of local interconnects during the formation of the elevated substrate.

12. The method as in claim 1 wherein the elevated substrate and the local interconnect are formed on the same level.

13. The method as in claim 1 wherein the step of forming an elevated substrate comprises the step of:

forming the elevated substrate in the first dielectric layer.

14. The method as in claim 1 wherein the step of forming circuit device elements in a base substrate comprises the step of:

forming source/drain regions in the base substrate.

15. A method of fabricating integrated circuits having multiple levels comprising the steps of:

forming a dielectric over a base substrate of a wafer;

forming interlevel interconnects in the dielectric;

forming an elevated substrate in at least one selected area over the base substrate and within a previously formed layer over the base substrate, wherein the elevated substrate is suitable for forming circuit device elements therein; and forming a local interconnect during the formation of the elevated substrate to interconnect at least two of the interlevel interconnects formed in the dielectric.

16. The method as in claim 15 further comprising the step of:

forming circuit device elements in a first substrate, wherein the interlevel interconnects are contacts to at least two of the circuit device elements, the dielectric is a first level dielectric formed on portion of the base substrate, and the previously formed layer over the base substrate is a second level dielectric formed on the first level dielectric.

17. A method of fabricating an integrated circuit comprising the steps of:

forming circuit device elements in a first substrate;

forming a first dielectric layer over the first substrate;

forming contacts in the first dielectric layer to at least a portion of the circuit device elements;

forming a second dielectric layer over the first dielectric layer;

removing separate portions of the second dielectric layer to form openings in the second dielectric layer;

forming a second substrate in at least one of the openings in the second dielectric, wherein the second substrate is suitable for forming circuit device elements therein; and forming a local interconnect in at least one of the openings in the second dielectric to interconnect at least two of the contacts formed in the first dielectric layer.

18. The method as in claim 17 further comprising the step of:

concurrently flattening the second substrate and local interconnect using a chemical mechanical polishing process.

19. The method as in claim 17 wherein the step of forming a second substrate and forming a local interconnect comprise the steps of:

blanket depositing substrate material over the second dielectric layer to fill the openings in the second dielectric layer; and removing the substrate material except for the substrate material deposited in the openings in the second dielectric layer.

20. The method as in claim 19 further comprising the step of:

forming a thin, conductive layer on the second dielectric layer prior to the step of blanket depositing the substrate material; and removing the thin, conductive layer except for the thin, conductive layer deposited in the openings in the second dielectric layer.

21. The method as in claim 17 wherein the step of forming circuit device elements in a first substrate comprises the step of:

forming a plurality of source/drain elements in a silicon substrate;

the method further comprising the step of:
forming a plurality of source/drain regions in the second substrate.

22. The method as in claim 17 further comprising the steps of:
forming a plurality of additional substrates over the second dielectric layer.

23. The method as in claim 22 wherein the step of forming a plurality of additional substrates over the dielectric layer is carried out at least approximately at the same time as the step of forming a second substrate over the dielectric layer.

24. The method as in claim 22 further comprising the steps of:
forming an insulating layer over the second dielectric layer; and
forming the second substrate and the additional substrates in the insulating layer.

25. The method as in claim 17 further comprising the step of:
forming a local interconnect over the dielectric layer during the step of
forming the second substrate over the dielectric layer.

26. The method as in claim 17 wherein the second substrate is polysilicon.

27. An integrated circuit chip fabricated according to the method of claim 17.

28. An electronic system including a microprocessor, a memory, and a system bus and having at least one integrated circuit fabricated according to the method of claim 17.

29. A method of fabricating an integrated circuit comprising the steps of:
patterning a dielectric layer elevated over a first substrate to select separate portions of the elevated dielectric layer for conductive substrate material deposition;
removing the selected portions of the elevated dielectric layer to form openings in the elevated dielectric layer; and
forming conductive substrate material in the elevated dielectric layer openings.

30. The method as in claim 29 further comprising the step of:
forming circuit elements in the conductive substrate material.

31. The method as in claim 30 wherein the step of forming circuit elements in the conductive substrate material comprises the step of:
forming a plurality of source/drain elements in the conductive substrate material.

32. The method as in claim 29 further comprising the steps of:
forming circuit device elements in the first substrate;
forming a first dielectric layer between the elevated dielectric layer and the first substrate; and
forming conductors in the first dielectric layer to electrically couple a plurality of the circuit device elements in the first substrate to conductive substrate material formed in one of the selected portions of the elevated dielectric layer openings.

33. The method as in claim 32 wherein the conductors are contacts and the circuit device elements are a gate of a transistor and a source/drain of a transistor.

34. The method as in claim 32 wherein the conductors are comprised of conducting material from a group consisting of tungsten, aluminum, copper, titanium, and polysilicon.

35. The method as in claim 29 further comprising the steps of:
forming a first dielectric layer over the elevated dielectric layer;
forming a second dielectric layer over the first dielectric layer;
patterning the second dielectric layer to select portions of the second dielectric layer for conductive substrate material deposition;
removing the selected portions of the second dielectric layer to form openings in the second dielectric layer; and
forming conductive substrate material in the openings in the second dielectric layer.

36. The method as in claim 35 further comprising the step of:
forming circuit elements in the conductive substrate material formed in the openings of the second dielectric layer.

37. The method as in claim 29 wherein the step of forming conductive substrate material comprises forming polysilicon in the elevated dielectric layer openings.

* * * * *